(12) United States Patent
Takeuchi et al.

(10) Patent No.: US 7,345,475 B2
(45) Date of Patent: Mar. 18, 2008

(54) ULTRASENSITIVE MAGNETOELECTRIC THIN FILM MAGNETOMETER AND METHOD OF FABRICATION

(75) Inventors: Ichiro Takeuchi, Berwyn Heights, MD (US); Manfred R. Wuttig, Silver Spring, MD (US)

(73) Assignee: University of Maryland, College Park, MD (US)

( * ) Notice: Subject to any disclaimer, the term of this patent is extended or adjusted under 35 U.S.C. 154(b) by 0 days.

(21) Appl. No.: 11/687,451

(22) Filed: Mar. 16, 2007

(65) Prior Publication Data

US 2007/0252593 A1 Nov. 1, 2007

Related U.S. Application Data

(60) Provisional application No. 60/743,525, filed on Mar. 17, 2006.

(51) Int. Cl.
*G01R 33/02* (2006.01)
(52) U.S. Cl. .................. 324/249; 365/157; 324/244
(58) Field of Classification Search ............ 324/244, 324/249; 360/114.01, 328; 365/7, 157; 438/52, 73; 73/779
See application file for complete search history.

(56) References Cited

U.S. PATENT DOCUMENTS 4,520,413 A * 5/1985 Piotrowski et al. ......... 360/328
6,809,515 B1 * 10/2004 Li et al. ..................... 324/260

OTHER PUBLICATIONS

M. Fiebig, "Revival of the magnetoelectric effect", Journal of Physics D: Applied Physics 38, R123-R152 (2005).

S. Dong, et al., "Ultrahigh magnetic field sensitivity in laminates of TERFENOL-D and Pb(Mg1/3Nb2/3)O3-PbTiO3 crystal", Appl. Phys. Lett., 83, 2265-2267 (2003).

K. Mori, et al., "Magnetoelectric coupling in Terfenol-D/polyvinylidenedifluoride composites", Appl. Phys. Lett 81, 100-101 (2002).

G. Srinivasan, et al., "Magnetoelectric interactions in bilayers of yttrium iron garnet and lead magnesium niobate-lead titanate: Evidence for strong coupling in single crystals and epitaxial films", Appl. Phys. Lett. 86, 222506-1-222506-3 (2005).

G. Srinivasan, et al., "Magnetoelectric interactions in hot-pressed nickel zinc ferrite and lead zirconante titanate composites", Appl. Phys. Lett. 85, 2250-2552 (2004).

(Continued)

*Primary Examiner*—Bot LeDynh
(74) *Attorney, Agent, or Firm*—Rosenberg, Klein & Lee

(57) ABSTRACT

An ultrasensitive room temperature magnetoelectric thin film magnetometer is fabricated on a cantilever beam and includes an active magnetoelectric multilayer structure having a plurality of thin films formed at a region defined on the cantilever beam. Upon application of a magnetic field, the active magnetoelectric structure generates a corresponding response of an electrical nature which is a measure of a value of the applied magnetic field. The material of the cantilever beam may be removed beneath the active magnetoelectric multilayer structure to form a freestanding modification of the magnetometer with superior sensitivity. The active magnetoelectric multilayer structure is either a bi-layer structure which includes a piezoactive (piezoelectric and/or piezoresistive) thin film deposited in contact with a magnetostrictive thin film or a tri-layer active structure (in the freestanding implementation) including a piezoactive thin film sandwiched between a pair of magnetostrictive thin films.

20 Claims, 6 Drawing Sheets

OTHER PUBLICATIONS

G. Srinivasan, et al., "Resonant magnetoelectric coupling in trilayers of ferromagnetic alloys and piezoelectric lead zirconate titanate: The influence of bias magnetic field", Phys. Rev. B (Condensed Matter and Materials Physics) 71, 184423-1-6 (2005).

J. Ryu, et al., "Magnetoelectric Properties in Piezoelectric and Magnetostrictive Laminate Composites," Jpn. J. Appl. Phys. 40, 4948-4951 (2001).

M. Murakami, et al., "Tunable multiferroic properties in nanocomposite PbTiO3-CoFe2O4 epitaxial thin films," Applied Physics Letters 87, 112901-1-3 (2005).

C. Gao, et al., "Measurement of the magnetoelectric coefficient using a scanning evanescent microwave microscope," Appl. Phys. Lett. 87, 153505-1-153505-3 (2005).

S. Dong, et al., "Enhanced magnetoelectric effects in laminate composites of Terfenol-D / Pb(Zr, Ti)O3 under resonant drive", Appl. Phys. Lett. 83, 4812-4814 (2003).

S. Dong, et al., "Circumferential-mode , quasi-ring-type, magnetoelectric laminate composite—a highly sensitive electric current and/or vortex magnetic field sensor", Appl. Phys. Lett., 86, 182506-1-182506-3 (2005).

S. Dong, et al., "Push-pull mode magnetostrictive/piezoelectric laminate composite with an enhanced magnetoelectric voltage coefficient", Appl. Phys. Lett., 87, 062502-1-062502-3 (2005).

J. Park, et al., "Fabrication and properties of PZT micro cantilevers using isotropic silicon dry etching process by XeF2 gas for release process," Sensors and Actuators, A 117, 1-7 (2005).

G. Kang, et al., "Fabrication and electromechanical properties of a self-actuating Pb(Zr0.52 Ti0.48)O3 microcantilever using a direct patternable sol-gel method," Appl. Phys. Lett. 88, 042904-1-3 (2006).

B. Piekarski, Ph.D. thesis, "Lead zirconate titanate thin films for piezoelectric actuation and sensing of MEMS resonators," University of Maryland (2005).

S.A. Mathews, et al., "The Effect of Substrate Constraint on the Martensitic Transformation of Ni-Ti Thin Films," Metallurgical and Materials Transactions A, 27A, 2859-2861 (1996).

Q. Su, et al., "Young's Modulus of Amorphous Terfenol-D Thin Films," J. Appl. Phys. 80, 3604-3606 (1996).

Q. Su, et al., "Graphoepitaxial NiTi shape memory thin films on Si," Appl. Phys. Lett, 73, 750-752 (1998).

J. Morillo, et al., "Micromachined silicon torsional resonator for magnetic anistotropy measurement," Rev. Sci. Instrum. vol. 69, No. 11, 3908-3912 (1998).

M. Wuttig, "Thin Film SMA/Si Composite Actuators," Proc. SPIE-Int. Soc. Opt. Eng. (USA), Proceedings of the SPIE—The International Society for Optical Engineering, vol. 3984 p. 450-455 (2000).

O. Famodu, et al., "Combinatorial Investigation of Ferromagnetic Shape-Memory Alloys in the Ni-Mn-Al Ternary System Using a Composition Spread Technique," Materials Transactions, JIM, vol. 45, No. 2, 173-177 (2004).

I. Takeuchi, et al., "Identification of novel compositions of ferromagnetic shape memory alloys using composition spreads," Nature Materials vol. 2, 180-184 (2003).

* cited by examiner

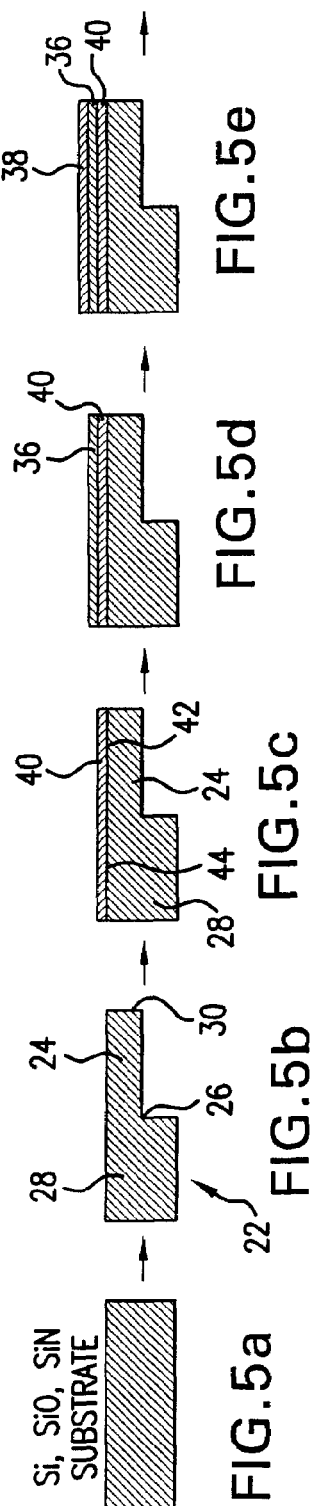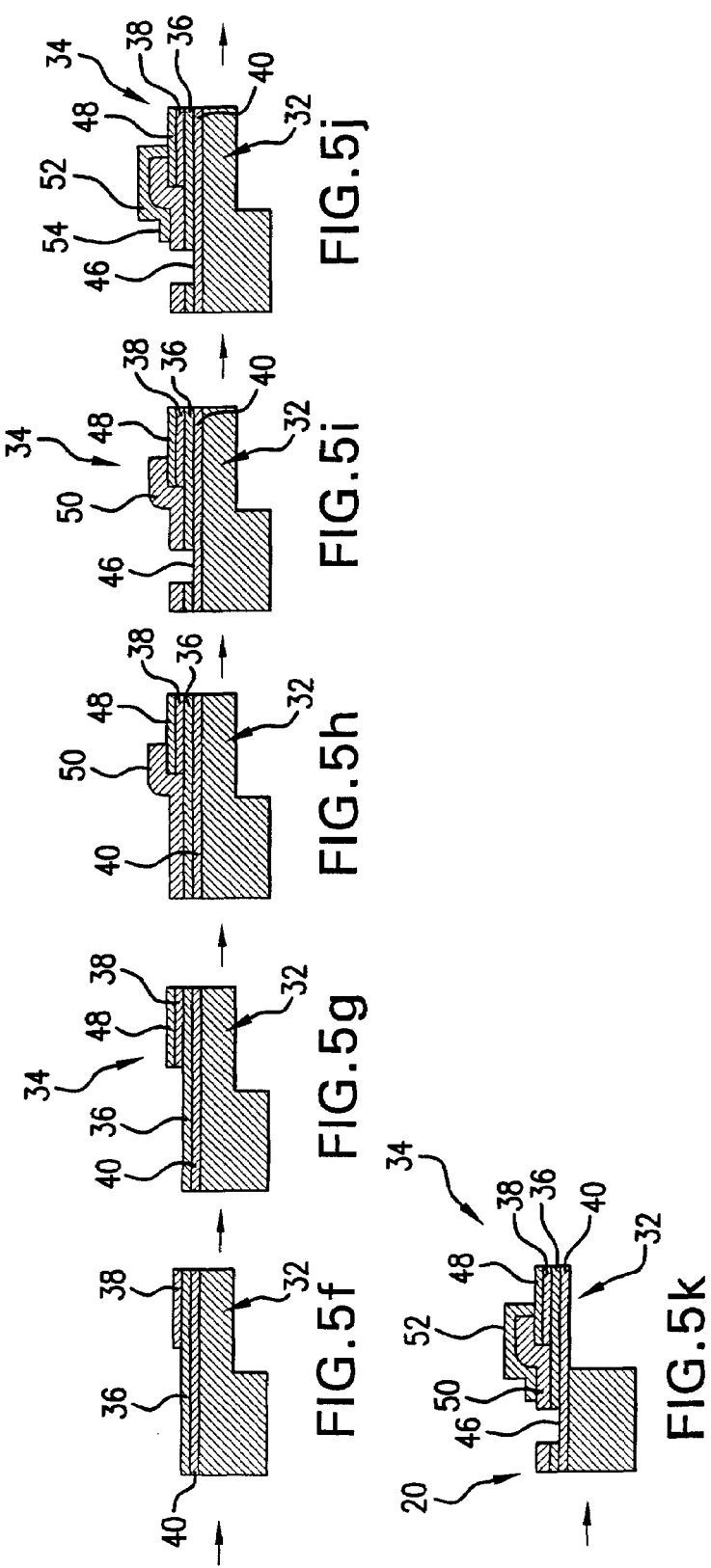

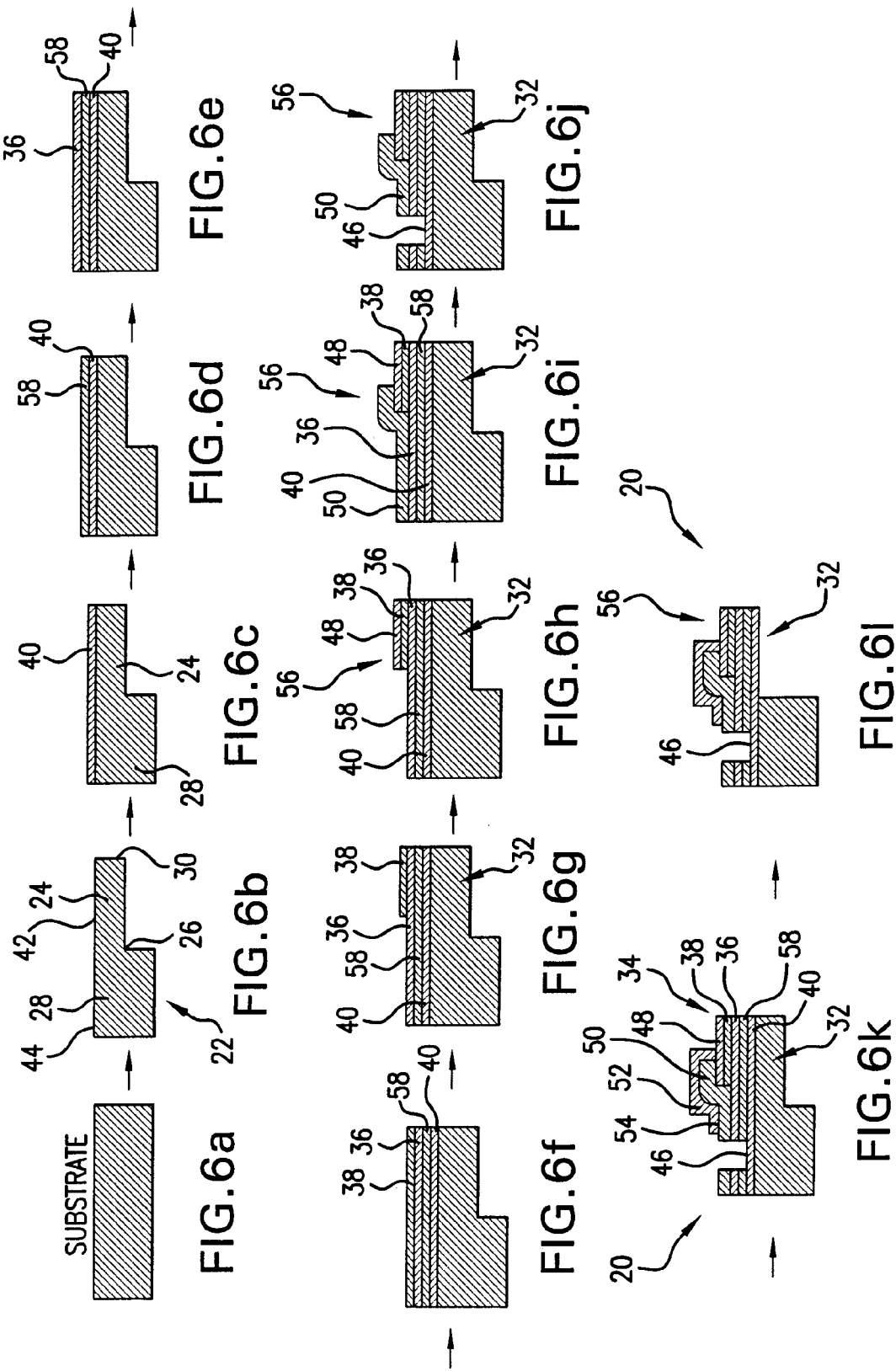

ULTRASENSITIVE MAGNETOELECTRIC THIN FILM MAGNETOMETER AND METHOD OF FABRICATION

REFERENCE TO RELATED APPLICATIONS

This utility patent application is based on the Provisional Patent Application Ser. No. 60/743,525 filed 17 Mar. 2006.

STATEMENT REGARDING FEDERALLY SPONSORED RESEARCH

The invention described herein was developed through research funded by the ONR under contact number N000140110761. The U.S. Government has certain rights to the invention.

FIELD OF THE INVENTION

The present system relates to ultrasensitive measurements of magnetic field at room temperature conditions. In particular the concepts elicited in the subject application relate to magnetoelectric thin film magnetometers.

More in particular, the present system is directed to multilayer thin film magnetoselective sensors formed on micromachined cantilevers which exhibit superior performance characteristics due to high magnetoelectric coupling between the piezoelectric (and/or piezoresistive) and magnetostrictive thin films in combination with advantages provided by a cantilever support.

The present system is also directed to a magnetoelectric thin film magnetometer which includes thin films of piezoactive materials and magnetostrictive materials in which the magnetic field induced strain in the magnetostrictive material is transferred to strain in the piezoelectric and/or piezoresistive material through elastic coupling which results in a piezo-induced voltage serving as a measure of the applied magnetic field.

The subject system is further directed to a magnetometer using a freestanding (unsupported) active multi-layer magnetoelectric structure formed of multi-phase materials fabricated by depositing thin film(s) of a magnetostrictive material on a thin film of a piezoelectric material in which an extremely high sensitivity to magnetic fields may be attained.

BACKGROUND OF THE INVENTION

Magnetic field is one of the most elementary and ubiquitous physical observables. Therefore, there are perennial needs for its detection with high sensitivity in a wide variety of applications ranging from nondestructive evaluation of integrated circuits to detection of brain activity signatures.

In the highest sensitivity limit, Superconducting Quantum Interference Devices (SQUIDs) have long served as the ultimate detectors with the sensitivity of $\sim 10^{-15}$ T/Hz$^{1/2}$ operating at 4.2 K. Recently, a number of alternative techniques have been demonstrated including an atomic magnetometer with subfemtotesla resolution and magnetoresistive sensors with $32 \times 10^{-15}$T (32 FT) sensitivity at 77 K. These techniques have significant drawbacks in that they require cryogenics and/or a cumbersome and unwieldy apparatus setup. From a practical and commercial point of view, these drawbacks inevitably translate to very expensive instruments or the tools not being suitable for everyday applications.

There is a perennial need to develop inexpensive high sensitivity magnetic field detectors to be used for a variety of applications including scanning magnetic probe microscopy. The ME effect devices may offer the solution for $\sim 10^{-12}$T sensitivity with a relatively simple setup in a room temperature environment.

It has been known to those skilled in the art that magnetostrictive materials may be utilized to perform relatively high sensitivity magnetic field detection ($\sim 10^{-11}$ T/Hz$^{1/2}$) at room temperature in a simple device configuration. Because many applications such as the detection of human brain activity (alpha waves), human heartbeat and inspection of electronic circuits do not require fT resolution, it is highly desirable to develop inexpensive $10^{-12}$ T (pT) resolution magnetometers which can be readily operated at room temperature.

The current surge of activity in multiferroic materials and structures are beginning to lead the way for the development of a new generation of magnetoelectric (ME) devices. Multiferroics are materials in which ferroelectricity and ferromagnetism coexist (Manfred Fiebig, "Revival of the magnetoelectric effect," Journal of Physics D: Applied Physics 38, R123-R152 (2005). The structures in which conversion of magnetic field to electric field takes place through coupling of the magnetostrictive effect (of the ferromagnetic component) and the piezoelectric effect (of the ferroelectric component) are referred to herein as magnetoelectric (ME) devices.

The basic principle of the magnetoelectric effect is that the magnetic field induced strain in the magnetostrictive material is transferred to a strain in the piezoelectric material through elastic coupling which results in a piezo-induced voltage. While there are different types of multiferroic materials, by far the most promising structures for use as a magnetostrictive layer are the two-phase materials typically fabricated by coupling a magnetostrictive layer to a piezoelectric sample in a bulk configuration.

The "strength" of the ME effect in a multiferroic system can be characterized by the ME coefficient given by:

$$\alpha^E = (\partial \epsilon / \partial H)(\partial E / \partial \epsilon) \tag{Eq. 1}$$

where H is the applied magnetic field, $\epsilon$ is the induced strain, and E is the resulting induced electric field.

The ME coefficient $\alpha^E$ carries information regarding the magnetostrictive coefficient of the magnetostrictive layer, the piezoelectric coefficient of the piezoelectric material as well as the elastic coupling between the two. While the first two are known and fixed for given materials, the elastic coupling may depend on the nature of the interface between the two layers as well as the geometry of the device. For a "perfect" coupling between two high coefficient materials, $\alpha^E$ as high as $\sim 1$ V/(cm Oe) has been predicted (S. Dong, J. Li, and D. Viehland, "Ultrahigh magnetic field sensitivity in laminates of TERFENOL-D and Pb(Mg$_{1/3}$Nb$_{2/3}$)O$_3$—PbTiO$_3$ crystal", Appl. Phys. Lett., 83, 2265-2267 (2003).

One of the first such structures was demonstrated by simply "gluing" a layer of Terfenol-D((Tb,Dy)Fe$_2$) to a ferroelectric polymer polyvinylidene fluoride (PVDF) where a significant ME signal was observed (K. Mori, and M. Wuttig, "Magnetoelectric coupling in Terfenol-D/polyvinylidenedifluoride composites", Appl. Phys. Lett 81, 100-101 (2002). There have been reports of the ME effect in various multiferroic structures (G. Srinivasan, C. P. DeVreugd, M. I. Bichurin and V. M. Petrov, "Magnetoelectric interactions in bi-layers of yttrium iron garnet and lead magnesium niobate-lead titanate: Evidence for strong coupling in single crystals and epitaxial films", Appl. Phys. Lett. 86, 222506-1-222506-3 (2005); G. Srinivasan, C. P. DeVreugd, C. S. Flattery, V. M. Laletsin, and N. Paddubnaya, "Magnetoelectric interactions in hot-pressed nickel zinc ferrite and lead zirconate titanate composites", Appl. Phys. Lett. 85, 2550-2552 (2004); G. Srinivasan, C. P. DeVreugd, V. M. Laletsin, N. Paddubnay, M. I. Bichurin, V. M. Petrov and D. A. Filippov, "Resonant magnetoelectric coupling in trilayers of ferromagnetic alloys and piezoelectric lead zirconate titanate: the influienc of bias magnetic field", Phys. Rev. B (Condensed Matter and Materials Physics) 71, 1844423-1-6 (2005); J. Ryu, Alfredo Vasques Carazo, Kenji Uchino and Hyoun-Ee Kim, "Magnetoelectric properties in piezoelectric and magnetostrictive laminate composites," Jpn. J. Appl. Phys. 40, 4948-4951 (2001).

Recently an ME device was fabricated by sputtering a multilayer thin film of TbFe/FeCo on a bulk single crystal $Pb(Mg_{1/3}Nb_{2/3})O_3$—$PbTiO_3$ (PMN-PT) to achieve a high ME signal (S. Stein, M. Wuttig, D. Viehland, and E. Quandt, "Magnetoelectric effect in sputtered composites", J. Appl. Phys. 97, 1-1-1-3 (2005). There have also been reports of observation of the ME effect in composite structured multiferroic materials including the $CoFe_2O_4$—$PbTiO_3$ epitaxial nanocomposite thin film (M. Murakami, K. -S. Chang, M. A. Aronova, C. -L. Lin, Ming H. Yu, J. Hattrick Simpers, M. Wuttig, I. Takeuchi, C. Gao, B. Hu, S. E. Lofland, L. A. Bedersky, "Tunable Multiferroic Properties in Nanocomposite $PbTiO_3$—$CoFe_2O_4$ Epitaxial Thin Films," Applied Physics Letters 87, 112901-1-3 (2005); C. Gao, Bo Hu, Xuefei Li, Chihui Liu, M. Murakami, K.-S. Chang, C. J. Long, M. Wuttig, and I. Takeuchi, "Measurement of the Magnetoelectric Coefficient using a Scanning Evanescent Microwave Microscope," Appl. Phys. Lett. 87, 153505-1-153505-3 (2005).

A series of devices consisting of Terfenol-D and PMN-PT have been fabricated which demonstrated extremely high sensitivity (S. Dong, J. Cheng, J. Li, and D. Viehland, "Enhanced magnetoelectric effects in laminate composites of TERFENOL-D/Pb(Zr, Ti)$O_3$ under resonant drive", Appl. Phys. Lett. 83, 4812-4814 (2003); S. Dong, J. Bai, J. Zhai, J. Li, J. Lu, and D. Viehland, "Circumferential-mode, quasi-ring-type, magnetoelectric laminate composite—a highly sensitive electric current and/or vortex magnetic field sensor", Appl. Phys. Lett., 86, 182506-1-182506-3 (2005); S. Dong, J. Zhai, J. Bai, J. Li, and D. Viehland, "Push-pull mode magnetostrictive/piezoelectric laminate composite with an enhanced magnetoelectric voltage coefficient", Appl. Phys. Lett., 87, 062502-1-062502-3 (2005). By operating the device at the mechanical resonant frequency, sensitivity as high as ~1 pT has been achieved. The observed ME coefficient typically ranges from ~mV/(cm Oe) to ~1 V/(cm Oe), with the high end being mostly observed under resonant conditions.

These devices are typically operated while they are biased with an external DC field so that the ME response is at its maximum. This is typically at the point in the magnetization-field (M-H) hysteresis curve where the susceptibility (derivative of the M-H curve) is maximum. The field to be detected is typically an AC field which modulates the response at the maximum susceptibility point. For optimum performance, the magnetic field is applied in parallel to the pre-magnetized direction of the magnetostrictive layer which is usually in the in-plane direction.

FIG. 1 schematically illustrates a common configuration of the ME device which has a sandwich structure in which two metallic magnetostrictive materials 10 sandwich the piezoelectric layer 12 therebetween and are also used as the electrodes to monitor the piezo-induced voltage. In this configuration, the strain induced in the piezoelectric layer 12 is converted to the voltage through the ME coefficient. The ME voltage is detected using a lock-in amplifier. The device can detect a field on the order of $10^{-12}$T.

Disadvantageously, high sensitivity ME devices demonstrated to date have been fabricated using bulk or hybrid laminate materials and are typically mm~cm in dimensions. In order to pursue their implementation in microelectronics and integration with other circuit components, it is desirable to fabricate all thin film based devices. However, due to the fact that ME devices rely on their layers being able to display mechanical flexibility, one disadvantage of thin film structures is that they inevitably have to be deposited on substrates thus being exposed to the substrate clamping effect which deteriorates the performance characteristics of ME devices.

The use of micromachined cantilevers allows thin films to exhibit some mechanical "freedom" and reduce the clamping effect caused by the substrate. Fabrication and utility of PZT (lead zirconium titanate) cantilever structures have been demonstrated by a number of groups (Joon-Shik Park, Hyo-Derk Park, Sung-Goon Kang, "Fabrication and properties of PZT micro cantilevers using isotropic silicon dry etching process by $XeF_2$ gas for release process," Sensors and Actuators, A 117, 1-7 (2005); Ghi Yuun Kang, Sang-Woo Bae, Hyung-Ho Park, and Tae Song Kim, "Fabrication and electromechanical properties of a self-actuating Pb $(Zr_{0.52}Ti_{0.48})O_3$ microcantilever using a direct patternable sol-gel method," Appl. Phys. Lett. 88, 042904-1-3 (2006); B. Piekarski, Ph.D. thesis, "Lead zirconate titanate thin films for piezoelectric actuation and sensing of MEMS resonators," University of Maryland (2005).

The above publications reported the use of PZT on cantilevers. Cantilevers have also been used to characterize mechanical properties of thin films of elastic materials such as shape memory alloys and ferromagnetic shape memory alloys (S. A. Mathews, Manfred Wuttig and Quanmin Su, "The Effect of Substrate Constraint on the Martensitic Transformation of Ni—Ti Thin Films," Met. Trans. 27A, 2859 (1996); Quanmin Su, J. Morillo, Y. Wen and Manfred Wuttig, "Young's Modulus of Amorphous Terfenol-D Thin Films," J. Appl. Phys. 80, 3604-3606 (1996); Quanmin Su, Yun Zheng and Manfred Wuttig, "Graphoepitaxial Shape Memory Thin Films on Si," Appl. Phys. Lett, 73, 750-752 (1998); J. Morillo, Quanmin Su, Don Novotny and Manfred Wuttig, "Micromachined silicon torsional resonator for magnetic anistotropy measurement," Rev. Sci. Instrum. 69, number 11, 3908-3912 (1998); M. Wuttig, "Thin film SMA/ Si composite actuators," Proc. SPIE-Int. Soc. Opt. Eng. (USA), Proceedings of the SPIE—The International Society for Optical Engineering, vol. 3984 p. 450-5; O. O. Famodu, J. Hattrick-Simpers, M. Aronova, K.-S. Chang, M. Murakami, M. Wuttig, T. Okazaki, Y. Furuya and I. Takeuchi, "Combinatorial Investigation of Ferromagnetic Shape-Memory Alloys in the Ni—Mn—Al Ternary system using a Composition Spread Technique," Materials Transactions, JIM, 45, 173-177 (2004); I. Takeuchi, O. Famodu, J. C. Rad, M. Aronova, K.-S. Chang, C. Craciunescu, S. E. Lofland, M. Wuttig, F. C. Wellstood, L. Knouse, A. Orozco, "Identification of Novel Compositions of Ferromagnetic Shape Memory Alloys using Composition Spreads," Nature Materials 2, 180-184 (2003).

Despite the previous developments in the field of thin film magnetoelectric materials, such have been supported by substrates thus inevitably suffering, through the substrate clamping effect, a deterioration in their coupling characteristics. No attempt has been done to avoid the substrate clamping effect. A magnetoelectric device built on a cantilever has not been suggested or developed in attempt to improve the performance of the thin film ME devices. Also, to date, no device has been developed or demonstrated, where all active layers were made of thin films. Piezoresistive layer has also never been used in conjunction with a magnetostrictive layer to fabricate a magnetoelectric structure.

It is therefore desirable to use advantages of thin film technology, as well as benefits allowed by cantilever structures, in a new magnetoelectric device with superior operational characteristics.

SUMMARY OF THE INVENTION

It is an object of the present system to provide an ultrasensitive magnetoelectric thin film magnetometer capable of superior operational characteristics at room temperatures based upon a cantilever concept.

It is another object of the present system to provide an ultrasensitive room temperature magnetoelectric magnetometer in which an active magnetoelectric multilayer thin film structure is formed at a predetermined region of a cantilever beam including a thin film formed of a piezoactive (piezoelectric and/or piezoresistive) material in contiguous contact with at least one thin film of a magnetostrictive material. Upon application of a magnetic field thereto, the active magnetoelectric structure generates a corresponding response of an electrical nature (voltage or current) serving as a measure of the applied magnetic field.

It is still a further object of the present system to provide an ultrasensitive room temperature magnetoelectric thin film magnetometer based on a cantilever structure in which an active magnetoelectric structure composed of a plurality of thin films (magnetostrictive material stacked with piezoelectric and/or piezoresistive material) are formed in a free standing manner, e.g., is formed at the edge of the cantilever beam and extends beyond the same being unsupported by the material of the cantilever beam in order to further promote operational characteristics of the overall magnetometer. In this device, the active magnetoelectric structure may include either a bi-layer active magnetoelectric region or a piezoelectric and/or piezoresistive thin film sandwiched between two magnetostrictive thin films.

It is a further object of the present system to provide a method for forming an ultrasensitive magnetoelectric thin film magnetometer using a thin film deposition technique in combination with various material removal steps to form a cantilever based magnetoelectric thin film magnetometer having superior operational characteristics.

In one aspect, the present system represents an ultrasensitive magnetoelectric thin film magnetometer which has a cantilever beam anchored at a first end to a cantilever support and a second end projecting from the cantilever support a predetermined distance from the first end. An active magnetoelectric multilayer structure including a plurality of thin films, is formed at a predetermined region of the cantilever beam in proximity to the second end. The active magnetoelectric multilayer structure includes a thin film formed of a piezoactive (piezoelectric and/or piezoresistive) material stacked with a thin film of a magnetostrictive material in a bi-layer implementation. In an alternative embodiment, the piezoactive thin film can be sandwiched between a pair of magnetostrictive thin films.

Upon application of a magnetic field to the active multilayer magnetoelectric structure, preferably in parallel to the longitudinal axis of thin films constituting the active magnetoelectric multilayer structure, an electric response in the form of an electric voltage or electric current is generated due to elastic coupling between the thin films of the active magnetoelectric multilayer structure which serves as a measure of the applied magnetic field.

The thickness of the cantilever beam may fall in the range of 10-100 μm. The width of the cantilever beam may range from 10-1000 μm, while the length of the cantilever beam is 4-50 times larger than the width thereof.

Since the underlying cantilever beam is of a small thickness, the clamping effect of the active structure with the material of the cantilever beam is minimized or negligible (especially in the case of freestanding structures).

Piezoactive material may include a piezoelectric and/or a piezoresistive material.

Piezoelectric material may be selected from a group consisting of:

Pb(Zr, Ti) Ti $O_3$(PZT), $(1-x)[Pb(Mg_{1/3}Nb_{2/3})O_3]-x[PbTiO_3]$(PMN–PT), $(1-x)[Pb(Zn_{1/3}Nb_{2/3})O_3]-x[PbTiO_3]$(PZN–PT), polyvinylidene fluoride (PVDF), and ZnO. Piezoresistive material may include doped silicone. The magnetostrictive material may be selected from a group consisting of $CoFe_2O_4$, metglass, Terfenol-D ((Tb, Dy)$Fe_2$), and TbFe/FeCo. The cantilever beam—cantilever support is made from either Si, $SiO_2$, SiN, or any combination thereof.

Contact pads are formed on upper and lower outside surfaces of the device (for the embodiment having a piezoelectric thin film) from which the electrical voltage (or electrical current) is acquired.

For the piezoresistive thin film, electrodes are made across the length of the piezoresistive material (where the magnetostrictive layer is formed on the top thereof) to acquire the resistance by applying voltage and measuring current.

The present system is further directed to an ultrasensitive magnetoelectric thin film magnetometer with a freestanding (unsupported) active magnetoelectric structure formed on the cantilever structure. The freestanding active magnetoelectric (ME) structure includes a plurality of thin films deposited one on the other and formed of at least one thin film of a magnetostrictive material and at least one thin film of a piezoelectric (and/or piezoresistive) material deposited in contiguous contact each with respect to the other. The freestanding active magnetoelectric structure may include another thin film of the magnetostrictive material formed in a manner that the piezoelectric (and/or piezoresistive) thin film is sandwiched between two magnetostrictive thin films.

In this device, the cantilever beam underneath the active ME structure is devoid of material, while the thickness of the cantilever support may be approximately 500 μm. The widths of the cantilever beam may fall in the range of 10-100 μm, but preferably below 10 μm, while the predetermined distance between the first and second ends of the cantilever beam is 4-50 times larger than the width.

The device with the freestanding active multilayer magnetoelectric structure extending beyond the edge of the cantilever beam unsupported provides for the highest sensitivity due to the absence of supporting material, with no clamping effect.

A present method for manufacturing an ultrasensitive magnetoelectric thin film magnetometer includes the steps of:

micromachining a substrate to form a cantilever beam, depositing a thin film of a piezoresistive (and/or piezoelectric) material on the cantilever beam, depositing a thin film of a magnetostrictive material on the piezoresistive (and/or piezoelectric) thin film, and patterning the magnetostrictive thin film to define an active magnetoelectric structure at the edge of the cantilever beam opposite the cantilever support.

For a piezoelectric thin film, the method further includes the steps of:
depositing a bottom contact layer on the top surface of the cantilever beam,
depositing an upper contact layer on the magnetostrictive thin film,
forming an opening in the piezoresistive (and/or piezoelectric) thin film to uncover a portion of the bottom contact layer thereby defining a bottom contact pad.

For a piezoresistive thin film, the method further includes the steps of forming electrodes across the length of the piezoresistive material underlying the length of the magnetostrictive thin film for measuring the resistance of the piezoresistive thin film.

In order to form a freestanding magnetoelectric active structure, a portion of the cantilever beam beneath the active magnetoelectric structure is removed preferably by a Bosch process.

For the freestanding active magnetoelectric structure, it is possible, instead of using a bi-layer active structure, to form a "symmetrical" active structure in which the piezoelectric thin film is sandwiched between a pair of magnetostrictive thin films. For this embodiment, the method is modified by depositing of a thin film of magnetostrictive material on the bottom contact layer prior to the deposition of the piezoelectric thin film.

Various thin film deposition techniques, as well as various material removal and patterning techniques, may be used for creation of the cantilever based ultrasensitive magnetoelectric thin film magnetometer of the present system and method.

These and other features and advantages of the present invention will become apparent from the further detailed description of the preferred embodiment taken in conjunction with accompanying patent drawings.

BRIEF DESCRIPTION OF THE DRAWINGS

FIG. 5 is a flow chart corresponding to fabrication of the magnetoelectric bi-layer thin film magnetometer of the present system;

FIG. 6 is a flow chart showing step-by-step the process of the present method for fabrication of a tri-layer thin film magnetometer.

DESCRIPTION OF THE PREFERRED EMBODIMENTS

Figure 1:
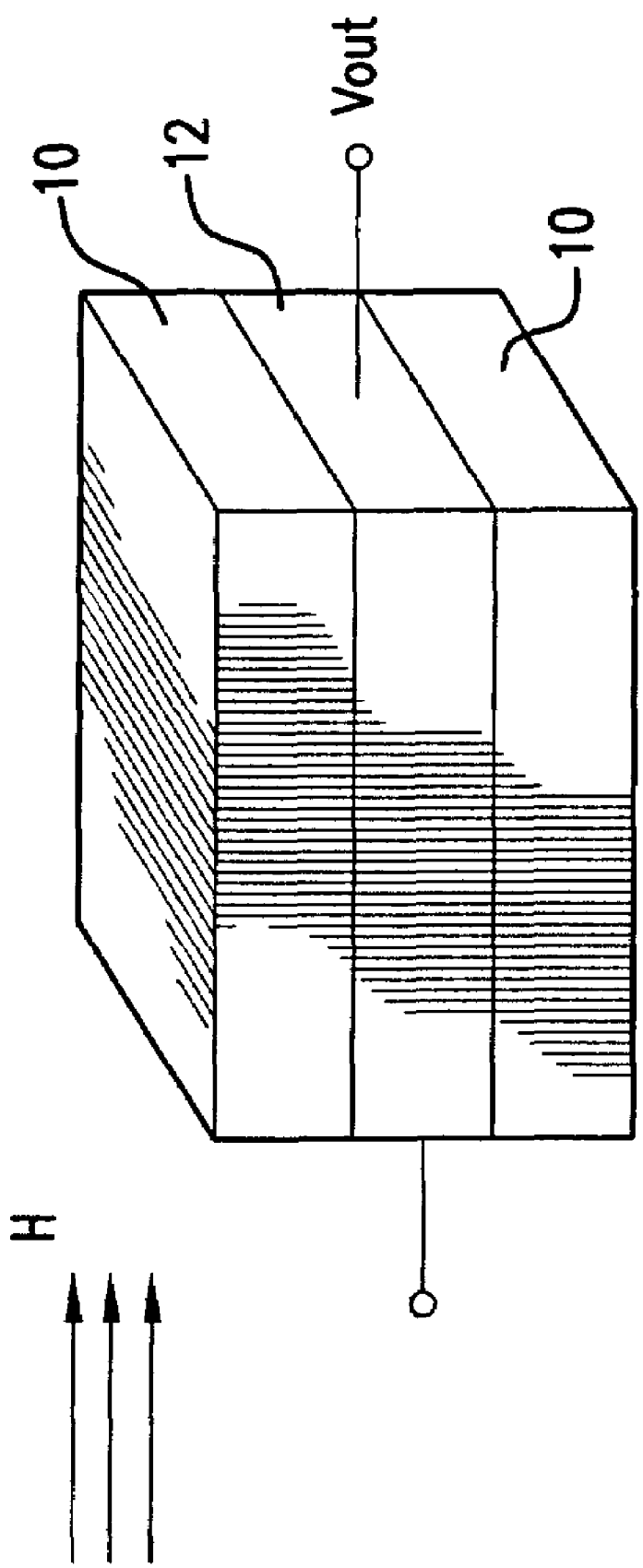
FIG. 1 is a prior art schematic representation of a magnetostrictive/piezoelectric laminate magnetoelectric structure.
Figure 2:
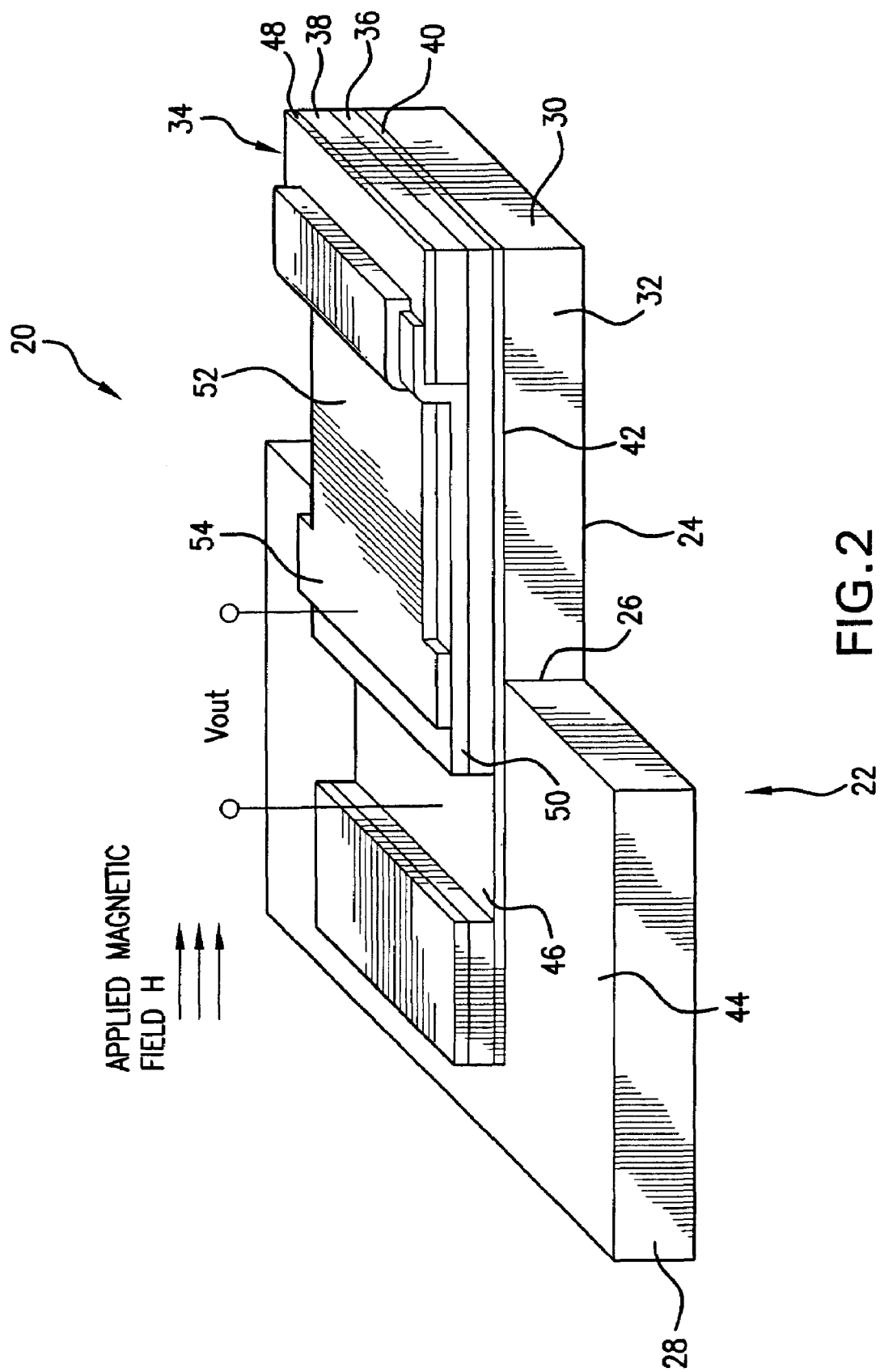
FIG. 2 is a perspective view of the cantilever based magnetoelectric thin film magnetometer of the present system.
Figure 3:
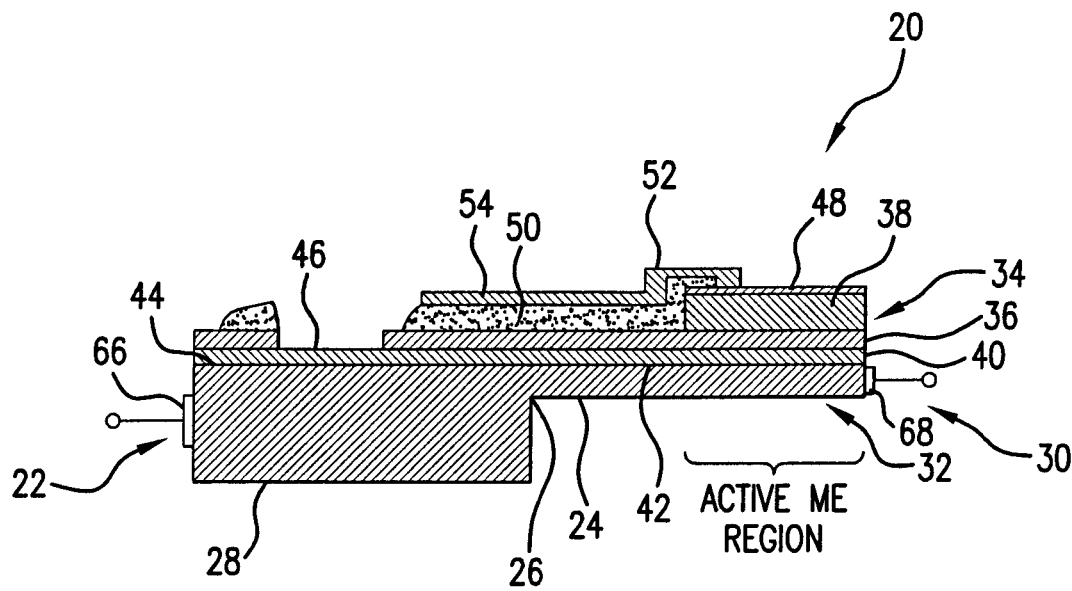
FIG. 3 is a side view of the cantilever based magnetoelectric thin film magnetometer shown in FIG. 2.
Figure 4:
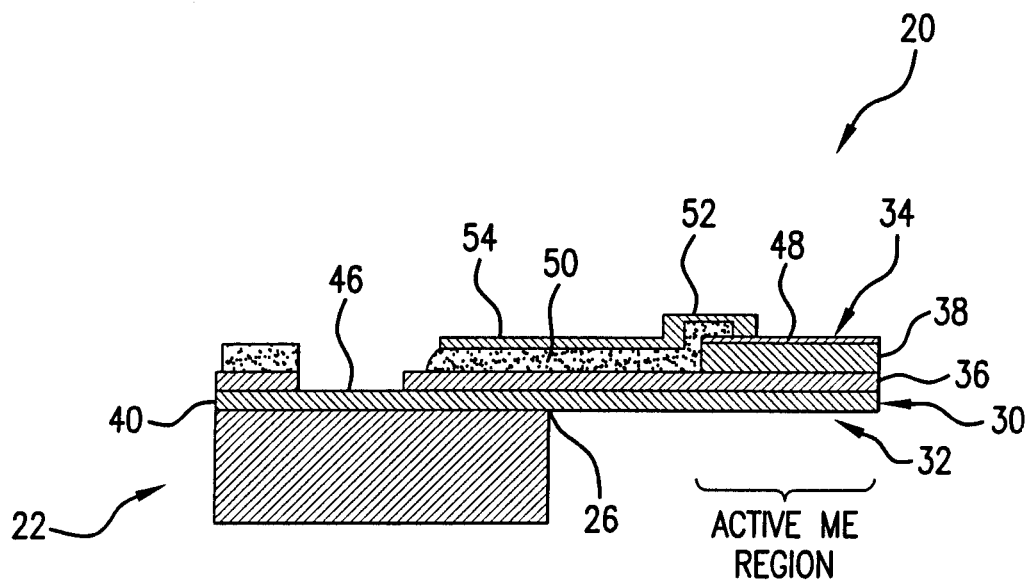
FIG. 4 is a side view of an alternative embodiment of the magnetoelectric thin film magnetometer of the present system with the freestanding active magnetoelectric structure.

Referring to FIGS. 2-4, the ultrasensitive magnetoelectric thin film magnetometer 20 of the present system includes a cantilever structure 22 formed from a substrate bulk micromachined element to define a cantilever beam 24 anchored at one end 26 to a cantilever support 28. The cantilever structure is preferably formed from a substrate of Si, $SiO_2$, SiN or any combination thereof. The cantilever structure is formed by etching the bulk substrate about half way through the entire thickness of the substrate (approximately 0.5 mm) through use of any material removal technique, which may be for example wet etching with KOH and diluted HF. The etching step is a rigorous process and may take up to ten hours to form the cantilever structure 22.

The cantilever beam 24 extends a predetermined length between the end 26 and end 30 thereof which may range from 4 to 50 times the width of the cantilever beam which may range between 10 μm to 1 mm. Alternatively, the width of the cantilever beam may range from 10 μm to 100 μm, and for a freestanding embodiment shown in FIG. 4 and described in detail in further paragraphs the width of the cantilever beam is much smaller, for example not exceeding 10 μm.

The thickness of the cantilever beam 24 may fall in the range of 50-500 μm (preferably, 10-100 μm) along the entire length of the cantilever beam between ends 26 and 30. Alternatively, for the embodiment shown in FIG. 4 the portion of the cantilever beam beneath the active region 32 is removed, e.g., the cantilever beam 24 is substantially devoid of material.

The active magnetoelectric region 32 is defined in proximity to the second end 30 of the cantilever beam 24 for carrying thereon an active magnetoelectric multilayer structure 34. The active magnetoelectric multilayer structure 34, shown in FIGS. 2-5, includes a thin film 36 formed of a piezoactive (piezoelectric and/or piezoresistive) material and a thin film 38 of a magnetostrictive material formed by depositing such on the piezoelectric thin film 36. Generally, a single piezoactive thin film (piezoelectric or piezoresistive) is used in the active ME structure 34. However, alternatively both piezoelectric and piezoresistive thin films may be formed in order to use the piezoresistive thin film for detection, and to use the piezoelectric thin film for mechanically driving the structure at the resonant frequency.

When the piezoactive thin film 36 is a made from a piezoelectric material, a bottom contact layer 40 is deposited on the top surface 42 of the cantilever beam and a top surface 44 of the cantilever support. The bottom contact layer 40 may be formed of platinum (Pt) which may be deposited by sputtering or evaporation techniques known to those skilled in the art and therefore not described herein in detail.

The piezoelectric thin film 36 may be formed of Pb(Zr, Ti) Ti $O_3$ (PZT), $(1-x)[Pb(Mg_{1/3}Nb_{2/3})O_3]-x[PbTiO_3]$(PMN–PT), $(1-x)[Pb(Zn_{1/3}Nb_{2/3})O_3]-x[PbTiO_3]$(PZN–PT), polyvinylidene fluoride (PVDF), and ZnO. The piezoelectric thin film 36 may be deposited by various techniques depending on what material is chosen for the piezoresistive thin film 36. For example, for Pb(Zr, Ti) Ti $O_3$ (PZT), $(1-x)[Pb(Mg_{1/3}Nb_{2/3})O_3]-x[PbTiO_3]$(PMN–PT), and $(1-x)[Pb(Zn_{1/3}Nb_{2/3})O_3]-x[PbTiO_3]$(PZN–PT), a pulsed laser deposition, sol-gel, sputtering and screen printing may be used. For PVDF, due to the fact that it is a polymer material, a wet chemical synthesis process may be used. For deposition of ZnO piezoresistive thin film 36, sol-gel, pulsed laser deposition, evaporation, chemical vapor deposition, sputtering, etc. processes may be used.

The piezoelectric thin film 36 is patterned to open a bottom contact pad 46 at a preferred location of the bottom contact layer 40 preferably in the area of the cantilever support 28. The piezoelectric thin film 36 may be patterned by wet etching using HF/HCL combination solution which may take seconds to minutes to complete, or alternatively, by ion milling which may take ~20 minutes-1 hour to open the contact pad 46. It is clear to those skilled in the art that the area of the contact pad 46 is defined by photolithography which is known to those skilled in the art and is not described herein in further detail.

The magnetostrictive thin film 38 is deposited on the top of the piezoelectric thin film 36 by an appropriate thin film deposition technique, for example sputtering. The magnetostrictive material for thin film 38 may include $CoFe_2O_4$, metglass, Terfenol-D((Tb, Dy)$Fe_2$) and TbFe/FeCo. Depending on the material of the magnetostrictive thin film 38, various thin film deposition techniques may be used. For example, for thin film magnetostrictive materials including $CoFe_2O_4$, sol-gel, sputtering, or pulsed laser deposition may be employed. For deposition of metglass, Terfenol-D((Tb, Dy)$Fe_2$) and TbFe/FeCo films, sputtering, or ion beam sputtering may be used among other deposition techniques.

A top contact layer 48 is further deposited on the top surface of the magnetostrictive thin film 38. The top contact layer may be formed of platinum or other contact materials by sputtering or evaporation.

Further, the magnetostrictive thin film 38 with the contact layer 48 are patterned for example by ion milling techniques to define the active structure 34 of predetermined dimensions in the range micrometers. Alternatively, the patterning of the thin film 38 may be performed prior to deposition of the top contact layer 48.

An isolation layer 50 may be further deposited and patterned on the portion of the magnetostrictive thin film (with the upper contact on the top) and extending over the top surface of the magnetoresistive film 36. The isolation layer is formed for example from $SiO_2$ on the surface of the piezoelectric thin film 36 (free of the magnetostrictive material) prior to formation of the bottom contact pad 46. The definition of the bottom contact pad 46, described in previous paragraphs, may be photolithographically fabricated for both layers, namely, the isolation layer 50, and piezoelectric thin film 36 in one technological step.

Upon patterning of the isolation layer 50, either individually, or in one step with the patterning of the piezoelectric thin film 36, a top electrode layer 52 is formed having an electrical contact with top contact layer 48 at one end and a contact pad 54 at another end so as to extend the top contact layer 48 on the magnetostrictive thin film 38 to a location convenient for further measurements. The top electrode layer 52 is electrically separated from the piezoelectric layer thin film 36 as shown in FIGS. 2-4. This top electrode layer 52 may be formed from platinum and patterned by ion milling.

The top contact layer 48 or contact pad 54, as well as the bottom contact pad 46 are formed to create top and bottom electrodes for the active magnetoelectric thin film layer structure 34 to measure the piezo-induced voltage generated by the magnetic field induced strain in the magnetostrictive layer 38.

Referring to FIG. 4, showing an alternative embodiment of the ultrasensitive magnetoelectric thin film magnetometer of the present system and method, the cantilever beam 24 is under-cut at the active magnetoelectric region 32 to remove the material of the cantilever beam completely from beneath the active magnetoelectric multilayer structure 34 thereby forming a freestanding active magnetoelectric multilayer structure 34. For this embodiment, the device dimensions are much smaller than for the supported magnetometer. For example, the width of the ME structure does not exceed 10 μm, while the length of the cantilever beam is 4-50 times of the width. The active ME structure 34 may occupy either a portion of the cantilever beam or substantially extend over entire lengths of the cantilever beam. Preferably the material removal in the embodiment shown in FIG. 4 is performed by the Bosch process using a fluorine-based plasma etching with sidewalls protection to permit a deep anisotropic etching of silicone and silicone containing materials of the cantilever beam. The Bosch process uses a process chamber which combines the capability for plasma-enhanced chemical vapor deposition, ion acceleration and plasma etch. The most common equipment for this process is a high density, inductively coupled plasma (ICP) system.

Although a bi-layer active magnetoelectric multilayer structure which is shown in FIGS. 2, 3 and 5 can be used in the embodiment shown in FIG. 4, e.g., in freestanding arrangement, it is preferred that a "sandwich" type active magnetoelectric multilayer structure 56 shown in FIGS. 4 and 6 is used for the freestanding embodiment. For this embodiment, the process described in the previous paragraphs is modified by depositing another magnetostrictive thin film 58 on the bottom contact layer 40 in order to form a symmetrical active structure. The freestanding embodiment of ultrasensitive magnetoelectric thin film magnetometer permits the attainment of a superior sensitivity due to the absence of a clamping effect from a material of the cantilever beam. In this embodiment, the width of the cantilever beam ranges from below 10 μm to 100 μm, but preferably does not exceed 10 μm.

The symmetric magnetostrictive/piezoelectric thin film multilayer magnetoelectric structure 56 permits operation of the device with optimized elastic coupling between thin films. In this device the magnetoelectric effect of a two-phase magnetostrictive/piezoelectric composite is a product tensor property combining the magnetoelastic and piezoelectric effects, e.g., wherein an applied magnetic field produces an elastic strain in the magnetic phase via magnetostrictive phenomena, which is then coupled to the piezoelectric phase inducing an electrical field E across the piezoelectric thin film 36 via piezoelectricity. It is preferred that the magnetic field H is applied along the longitudinal axis of the active ME multilayer structure 34 (or 56) due to a strong maximum longitudinal magnetostriction (expansion) of the magnetostrictive thin film under a DC magnetic bias in this direction. Under an applied magnetic field, the symmetric expanding/contracting elastic strain is excited in the magnetostrictive thin film 38 via magnetostriction.

Correspondingly, the piezoelectric thin film 36 is also driven into strain/motion, and an electrical field is induced across the piezoelectric thin film 36 via piezoelectricity. This is the dual (magneto-elasto-electric) coupling that results in magnetoelectric product tensor properties. This electric field is measured between the bottom contact pad 46 and top contact layer 48 (or the contact pad 54) to determine the value of the applied magnetic field. Although the bi-layer thin film active magnetoelectric multilayer structure 34 performs satisfactorily at room temperature, the three layer structure 56 has an optimized elastic interaction between the magnetostrictive and piezoelectric layers.

Effective conversion between magnetic and electric signals is extremely desirable for a large number of device applications. The device of the present invention uses multiferroics, which are simultaneously ferroelectric and ferromagnetic, and which exhibit coupling effects between ferromagnetic and ferroelectric properties. This spontaneous electric polarization can be modulated by an applied magnetic field, and the spontaneous magnetization can be changed by an applied electric field. In the composite multiferroics, such as in the present system, the magnitude of such effects is strongly dependent on the efficacy of the elastic coupling between magnetostrictive and piezoelectric components.

In order to elucidate and quantify the nature of the ME coupling, it is important to measure the ME coefficient, $\alpha_{ME}$, which is defined as a ratio of the induced electric field E caused by the applied magnetic field H. Common ME measurement techniques are based on the capacitor structures. In such a measurement, an AC magnetic field $H_{ac}$ is applied to the parallel plane capacitor consisting of a magnetoelectric material under a DC magnetic bias, and the coefficient is deduced by monitoring the open voltage or short current across the capacitor with a lock-in amplifier.

It has been shown that ME signals are amplified at the mechanical resonant frequency of the device. The cantilever based ultrasensitive magnetoelectric thin film magnetometer of the present system has a natural geometry for resonant drive, so that the ME signal of the device of the present system exhibits resonant enhancement when detecting the AC field modulated at the resonant frequency which is determined by the size of the device which may range from microns to hundreds of microns.

The device of the present system may be implemented in multiprobe systems where multiple devices are multiplexed and operated together in sensor arrays. This will include geometries where there are multiple ME devices on a single chip or in a spatially distributed configuration over multiple chips. Such systems with microfabricated devices have many immediate applications such as for example, vector field sensors and biomedical sensing. It is also envisioned that the ultrasensitive magnetoelectric thin film magnetometer of the present system will be used in atomic force microscopy configuration with cantilever tip-sample surface distance control.

The ultrasensitive magnetoelectric thin film magnetometer of the present system is less expensive compared to existing high sensitivity detection technology. In biomagnetisim there are activities that do not require magnetic detection with better than $10^{-12}$T sensitivity such as detection of heartbeat or brain (alpha) waves. For each application, the proposed devices may be used as the main component of compact biomedical systems operating at room temperature.

The device of the present system represents the next generation of ME magnetometers with high sensitivity and spatial resolution capability not seen in other techniques operating at room temperature. The ME devices fabricated to date have predominately been large in size, e.g., typically in the order of 5 mm×1 cm in the lateral dimension. While this size scale makes the existing devices relatively easy and inexpensive to manufacture, they are not particularly suitable for integration with other electronic components and packaging for sensing with high spatial resolution. The present system circumvents this problem by going to microfabricated or thin film magnetoelectric sensors. In particular, the device of the present system is formed on a micromachined cantilever, which significantly enhances the overall functionalities of the device while maintaining a high magnetic field sensitivity.

Bulk laminate devices seen in the prior art often suffer from uneven and unreliable adhesion of the magnetostrictive/piezoelectric layers which critically undermine the elastic coupling and consequently the ME signal. Coupling of the magnetostrictive layer and the piezoelectric layer in the present system is achieved through natural adhesion of one thin film layer deposited on another, which is much more reliable than epoxy used to glue laminate structures together in bulk devices and further gives higher ME coupling coefficient.

Further, the nature of the device of the present system based on cantilever and thin film technology readily facilitates future integration of the device with various electronic components as well as development of novel sensor array systems. The thin film device of the present system is fabricated on the micromachined cantilever in order to minimize the clamping effect of the substrate (existing in the substrate based prior art devices) which acts to reduce the magnetoelectric coupling of the multi-layer active structure. Clamping effect is greatly minimized in the structures shown in FIGS. 2 and 3, and altogether eliminated in the structure shown in FIG. 4.

Since the device of the present invention operates at room temperature, it is less expensive to implement than existing high sensitivity magnetic field sensors such as SQUIDs and HALL sensors.

Referring to FIGS. 5a-5k representing a sequence of fabrication steps of the present method, as shown in FIG. 5b, a cantilever structure 22 is created by bulk micromachining the substrate (FIG. 5a) about halfway through the entire thickness thereof to form a cantilever beam 24 attached to the cantilever support 28. This is done for example by wet etching of the substrate with KOH and diluted HF for approximately 10 hours. Further, as shown in FIG. 5c, a bottom contact layer 40 is deposited on the top surfaces 42 and 44 of the cantilever structure 22 which may be for example, a platinum layer deposited by sputtering or evaporation. Further, as shown in FIG. 5d, for creation of the bi-layer active structure 34 a piezoelectric thin film 36 is deposited on the top of the bottom contact layer 40.

As presented in previous paragraphs different combinations of thin film piezoelectric materials including Pb(Zr, Ti) Ti $O_3$ (PZT), $(1-x)[Pb(Mg_{1/3}Nb_{2/3})O_3]-x[PbTiO_3](PMN-PT)$, $(1-x)[Pb(Zn_{1/3}Nb_{2/3})O_3]-x[PbTiO_3](PMN-PT)$, polyvinylidene fluoride (PVDF), and ZnO may be used for the piezoelectric thin film 36.

For Pb(Zr, Ti) $TiO_3$ (PZT), $(1-x)[Pb(Mg_{1/3}Nb_{2/3})O_3]-x[PbTiO_3](PMN-PT)$, $(1-x)[Pb(Zn_{1/3}Nb_{2/3})O_3]-x[PbTiO_3](PMN-PT)$, a pulsed laser deposition, sol-gel, sputtering and screen printing may be used. For PVDF, a wet chemical synthesis process may be used. While for ZnO, a sol-gel or pulsed laser deposition, evaporation, chemical vapor deposition, sputtering, etc. can be used.

Further, as shown in FIG. 5e, a magnetostrictive thin film 38 is deposited on the piezoelectric thin film 36. As was presented in previous paragraphs the magnetostrictive material used for the layer thin film 38 may include $CoFe_2O_4$, metglass, Terfenol-D((Tb, Dy)$Fe_2$) and TbFe/FeCo. Sol-gel, sputtering, PLD techniques may be used for deposition of $CoFe_2O_4$. Sputtering, ion beam sputtering, etc. may be used for deposition of metglass, Terfenol-D, and TbFe/FeCo thin films. The magnetostrictive thin film 38 is patterned preferably by ion milling for a few minutes to define an active bi-layer structure 34, as shown in FIG. 5f. The remaining portion of the magnetostrictive thin film 38 is covered with the thin contact layer 48, as shown in FIG. 5g, which is preferably a platinum layer deposited by sputtering or evaporation for a top contact of the device, as shown in FIG. 5h.

The isolation layer 50 of $SiO_2$ is deposited in the step shown in FIG. 5h. In a further step shown in FIG. 5i, the isolation layer 50, and the piezoelectric thin film 36 are patterned to uncover a bottom contact pad 46 at a predetermined area of the bottom contact layer 40. The sequence of fabrication steps may also take an alternative route. For example, the piezoelectric thin film 36 may be patterned to uncover the bottom contact pad 46 prior to deposition of the isolation layer 50, which is then patterned in a separate step to form an opening therein aligned with the opening in the piezoelectric thin film 36. Additionally, the contact layer 48 may be formed prior to the patterning of the magnetostrictive thin film 38. It will be clear to those skilled in the art that the method illustrated in FIGS. 5a-5k is one of many examples, and other techniques, regimes and sequences of the fabrication steps are contemplated in the present patent application.

Further, in FIG. 5j, the top electrode layer 52 is formed atop the isolation layer 50 which has a electrical contact with the top contact layer 48 at one end and which forms a contact pad 54 at the location determined by the device designer for extending the top contact 48 to a position desirable for a particular device application.

Further, in FIG. 5k, a portion of the cantilever beam 24 may be undercut beneath the active structure 34 in order to form a freestanding modification of the device of the present invention. This step is performed preferably by a Bosch process. Alternatively, a laser cutting may be used to remove material of the cantilever beam from under the active magnetoelectric structure 34.

Alternatively, as shown in FIGS. 6a-6l, an active ME multilayer structure 56 is formed which includes a piezoelectric thin film 36 sandwiched between a pair of magnetostrictive thin films 58 and 38 to operate in the freestanding modification of the device of the present system. In this alternative method, after the deposition of the bottom contact layer 40 on the micromachined cantilever structure, shown in FIGS. 6a-6c, a magnetostrictive thin film 58 is deposited on the bottom contact layer 40 as shown in FIG. 6d. Further, a piezoelectric thin film 36 is deposited on the magnetostrictive thin film 58, as shown in FIG. 6e.

Further fabrication steps shown in FIGS. 6f-6l are performed similar to the steps of FIGS. 5e-5k with the difference that, instead of the bi-layer active structure 34, a three layer active structure 56 is created.

In FIG. 6f, a magnetostrictive thin film 38 is formed on the piezoelectric thin film 36. The thin film 38 is patterned (FIG. 6g) and an upper contact 48 is deposited thereon (FIG. 6h), thereby creating the active tri-layer magnetoelectric structure 56 at the active region 32. Further, as shown in FIG. 6i, the isolation layer 50 of $SiO_2$ is formed, and after the isolation layer 50 is deposited, a bottom contact pad 46 is uncovered by for example wet etching of the isolation layer 50, piezoelectric thin film 36 and the magnetostrictive thin film 58 through, as shown in FIG. 6j, to uncover a portion of bottom contact layer 40 thus defining a bottom contact pad 46.

Further, as shown in FIG. 6k, the top electrode layer 52 is deposited and patterned to form a contact pad 54. The portion of the cantilever beam 24 beneath the active structure 56 is removed completely, as shown in FIG. 6l, to leave the three layer thin film active structure 56 extending beyond the edge of the cantilever beam. In this freestanding implementation, either for the bi-layer active magnetoelectric structure 34 or the tri-layer active magnetoelectric thin film structure 56, the widths of the cantilever beam ranges from below 10 μm to 100 μm with the length of the cantilever beam ranging from 4-50 times larger than the width thereof.

Figure 7:
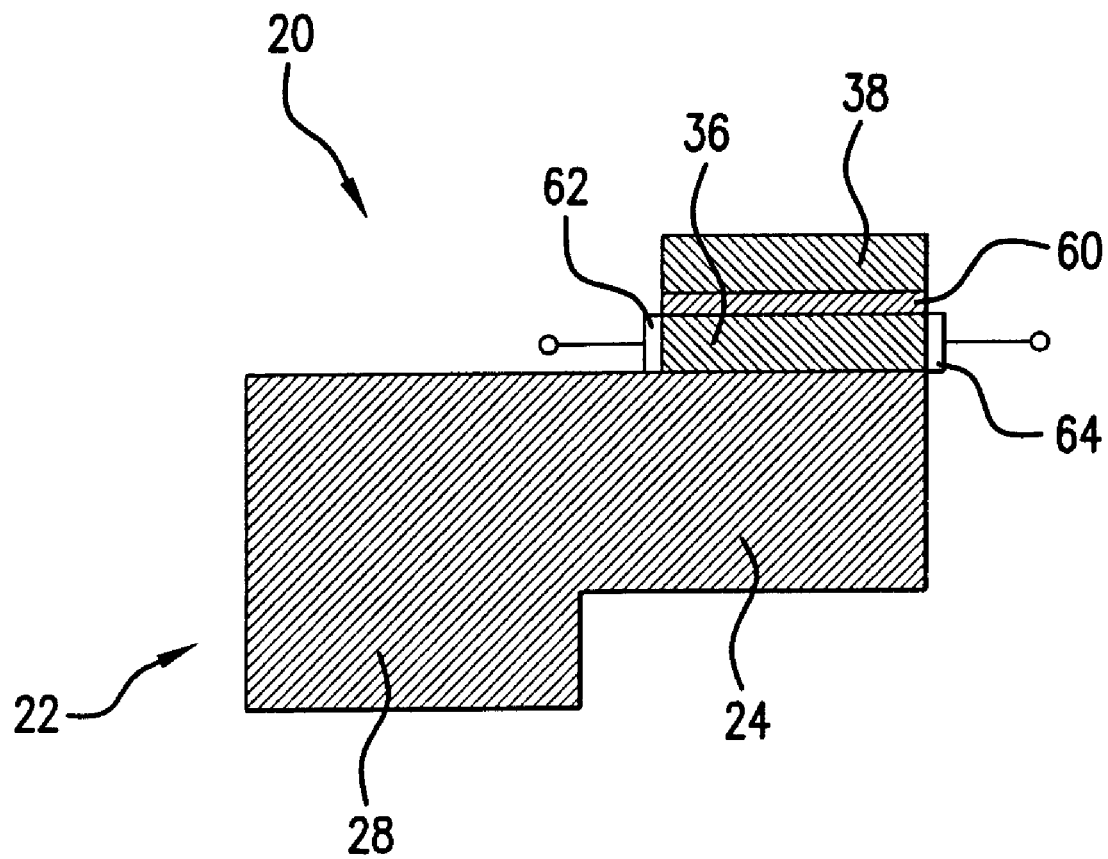
FIG. 7 is a simplified side view of the magnetoelectric thin film magnetometer of the present system using a piezoresistive thin film.

Another embodiment of the present system is shown schematically in FIG. 7, wherein the piezoactive thin film 36 is made from a piezoresistive material, for example, doped Si. For this embodiment, the piezoresistive thin film 36 is formed on the cantilever beam 24 anchored to the cantilever support 28 of the cantilever structure 22. A thin insulator layer 60 is formed for example from $SiO_2$ between the piezoresistive thin films 26 and the magnetostrictive thin film 38 if the thin film 38 is made from a conducting material, such as Terfenol or metglass in order to prevent short/shunt between films 36 and 38. For the magnetostriction film 38 formed from $CoFe_2O_4$, such an insulator layer 60 is not needed. Electrodes 62 and 64 are made across the length of the film 36 for the measurements.

In the embodiment using both piezoresistive and piezoelectric materials, as may be desirable for both detection of the magnetic field (piezoresistive material) and driving the structure at the resonant frequency (piezoelectric material) as shown in FIG. 3, the material of the cantilever may be used as the piezoresistor. For this embodiment, electrodes 66 and 68 are formed across the length of the cantilever structure 22 for measurements on the piezoresistive portion of the magnetometer. In this structure, the contacts 46 and 48 (54) are used for measurements on the piezoelectric portion of the present magnetometer.

Although this invention has been described in connection with specific forms and embodiments thereof, it will be appreciated that various modification other than those discussed above may be resorted to without departing from the spirit or scope of the invention as defined in the appended claims. For example, equivalent elements may be substituted for those specifically shown and described, certain features may be used independently of other features, and in certain cases, particular locations of the elements may be reversed or interposed all without departing from the spirit or scope of the invention as defined in the appended claims.

What is claimed is:

1. Ultrasensitive magnetoelectric thin film magnetometer, comprising:
   a cantilever beam anchored at a first end thereof to a cantilever support, said cantilever beam having a second end thereof projecting from said cantilever support a predetermined distance from said first end; and
   an active magnetoelectric multi-layer structure including a plurality of thin films, formed at a predetermined region of said cantilever beam between said first and second ends thereof, said active magnetoelectric structure including at least one thin film of a magnetostrictive material and at least one thin film of a piezoactive material formed in contiguous contact each with respect to the other at said predetermined region of said cantilever beam;
   wherein upon application of a magnetic field thereto, said active magnetoelectric multi-layer structure generates a corresponding electrical response, said response being a measure of said applied magnetic field.

2. The magnetometer of claim 1, wherein said cantilever beam at said predetermined region thereof underlying said active magnetoelectric multi-layer structure is devoid of material.

3. The magnetometer of claim 1, wherein said piezoactive material includes a piezoelectric material, further comprising:
a first contact layer extending on a top surface of said cantilever beam and a top surface of said cantilever support, and
an upper contact pad formed on said at least one thin film of the magnetostrictive material,
wherein said at least one thin film of the piezoactive material is disposed above said first contact layer, and said at least one thin film of the magnetostrictive material is disposed on said at least one thin film of the piezoactive material.

4. The magnetometer of claim 2, further comprising:
a further thin film of the magnetostrictive material, said at least one thin film of the piezoactive material being sandwiched between said at least one and said further thin film of the magnetostrictive material.

5. The magnetometer of claim 3, further comprising:
a bottom contact pad located at a predetermined area of said first contact layer, and
a second contact layer electrically coupled to said upper contact pad.

6. The magnetometer of claim 5, wherein said at least one thin film of the piezoactive material extends above said first contact layer on said top surfaces of said cantilever beam and cantilever support, and wherein said at least one thin film of the piezoactive material has an opening formed through an entire thickness thereof above said top surface of said cantilever support, said bottom contact pad being formed by an area of said first contact layer uncovered within said opening.

7. The magnetometer of claim 5, further comprising:
an isolation layer extending between said second contact layer and said at least one thin film of the piezoactive material.

8. The magnetometer of claim 1, wherein the thickness of said cantilever beam is in the approximating range of 0-500 µm,
wherein the width of said cantilever beam is in the approximating range of 10-1000 µm, and
wherein said predetermined distance between said first and second ends of said cantilever beam is approximately 4-50 times larger than the width of said cantilever beam.

9. The magnetometer of claim 1, wherein said at least one piezoactive thin film includes a piezoelectric material, the magnetometer further including a piezoresistive structure having a predetermined length, said piezoelectric thin film having a bottom and top electrode electrically coupled thereto, and said piezoresistive structure having at least a pair of said electrodes attached thereto across said length thereof.

10. The magnetometer of claim 1, wherein said piezoactive material is selected from a group consisting of a piezoelectric material and a piezoresistive material, wherein said piezoelectric material is selected from a group consisting of: Pb(Zr, Ti) Ti $O_3$ (PZT), $(1-x)[Pb(Mg_{1/3}Nb_{2/3})O_3]-x[PbTiO_3]$(PMN-PT), $(1-x)[Pb(Zn_{1/3}Nb_{2/3})O_3]-x[PbTiO_3]$(PMN-PT), polyvinylidene fluoride (PVDF), ZnO; and
wherein said piezoresistive material includes doped Si.

11. The magnetometer of claim 1, wherein said magnetostrictive material is selected from a group consisting of: $CoFe_2O_4$, metglass, Terfenol-D ((Tb, Dy)$Fe_2$), and TbFe/FeCo.

12. The magnetometer of claim 1, wherein said cantilever beam and cantilever support are made from a material selected from a group consisting of Si, $SiO_2$, SiN, and any combination thereof.

13. The magnetometer of claim 5, wherein said applied magnetic field is an AC magnetic field applied in parallel to said plurality of thin films, and wherein said electrical response is a voltage measured between said upper and bottom contact pads.

14. Ultrasensitive magnetoelectric thin film magnetometer, comprising:
a cantilever beam anchored at a first end thereof to a cantilever support, said cantilever beam having a second end thereof projecting from said cantilever support a predetermined distance from said first end; and
a free-standing active magnetoelectric multi-layer structure formed at said cantilever beam, wherein said cantilever beam between said first and second ends thereof underlying said active magnetoelectric multi-layer structure is devoid of material, said free-standing active magnetoelectric multi-layer structure including a plurality of thin films deposited one on another, said plurality of thin films being formed of at least one thin film of a magnetostrictive material and at least one thin film of a piezoactive material formed in contiguous contact each with respect to the other,
wherein upon application of a magnetic field thereto, said free-standing active magnetoelectric structure generates a voltage response corresponding to the value of said magnetic field.

15. The magnetometer of claim 14, wherein said free-standing active magnetoelectric structure further includes another thin film of the magnetostrictive material, said at least one piezoactive thin film being sandwiched between said at least one and another thin films of the magnetostrictive material.

16. The magnetometer of claim 14, further comprising:
a first contact layer underlying said free-standing active magnetoelectric multi-layer structure and extending on a top surface of said cantilever beam and a top surface of said cantilever support, a bottom contact pad being formed at a predefined area of said first contact layer, and
an upper contact pad formed on said at least one thin film of the magnetostrictive material.

17. The magnetometer of claim 14, wherein the width of said cantilever beam is in the range below 10 µm to 100 µm, and wherein said predetermined distance between said first and second ends of said cantilever beam is approximately 4-50 times larger than the width of said cantilever beam.

18. A method for manufacturing an ultra-sensitive magnetoelectric thin film magnetometer, comprising the steps of:
micromachining a substrate to form a cantilever beam anchored at a first end thereof to a cantilever support and having another end projecting from said cantilever support a predetermined distance from said first end;
depositing at least one thin film of a piezoactive material above said first contact layer;
depositing at least one thin film of a magnetostrictive material on said at least one piezoactive thin film; and
patterning said at least one magnetostrictive thin film to define an active magnetoelectric multi-layer structure containing said at least one piezoactive thin film and said at least one magnetostrictive thin film, said active magnetoelectric multi-layer structure being formed in proximity to said second end of said cantilever beam.

19. The method of claim 18, further comprising the step of:
   removing a portion of said cantilever beam beneath said active magnetoelectric multi-layer structure, thereby forming a free-standing said active magnetoelectric multi-layer structure.

20. The method of claim 19, further comprising the step of:
   prior to deposition of said at least one piezoactive thin film, depositing another thin film of the magnetostrictive material on said first contact layer, thereby sandwiching said at least one piezoactive thin film between said at least one and said another magnetostrictive thin films.

* * * * *